(12) United States Patent
Thomas, Jr.

(10) Patent No.: US 10,352,987 B2
(45) Date of Patent: Jul. 16, 2019

(54) SOLID STATE SWITCH POWER EMULATOR

(71) Applicant: U.S. Army Research Laboratory ATTN: RDRL-LOC-I, Washington, DC (US)

(72) Inventor: Richard L. Thomas, Jr., Baltimore, MD (US)

(73) Assignee: The United States of America as represented by the Secretary of the Army, Washington, DC (US)

(*) Notice: Subject to any disclaimer, the term of this patent is extended or adjusted under 35 U.S.C. 154(b) by 77 days.

(21) Appl. No.: 15/615,861

(22) Filed: Jun. 7, 2017

(65) Prior Publication Data

US 2017/0350941 A1 Dec. 7, 2017

Related U.S. Application Data

(60) Provisional application No. 62/346,721, filed on Jun. 7, 2016.

(51) Int. Cl.
*G01R 31/26* (2014.01)
*G01R 31/327* (2006.01)
*G01R 31/319* (2006.01)

(52) U.S. Cl.
CPC ..... *G01R 31/2608* (2013.01); *G01R 31/3271* (2013.01); *G01R 31/31926* (2013.01)

(58) Field of Classification Search
CPC .. H02M 2001/0003; H02M 1/32; H02M 1/36; H02M 1/38; H02M 3/156; G01R 31/2849; G01R 31/2851; G01R 31/318575; G01R 31/31926; G01R 31/31905; G01R 31/3271; G01R 31/2608
See application file for complete search history.

(56) References Cited

U.S. PATENT DOCUMENTS

| 4,694,242 A * | 9/1987 | Peterson | G01R 31/31905 324/537 |
| 5,414,352 A * | 5/1995 | Tanase | G01R 31/2851 324/73.1 |
| 7,560,947 B2 * | 7/2009 | Sartschev | G01R 31/31924 324/762.01 |
| 2002/0125904 A1 * | 9/2002 | Eldridge | G01R 31/31721 324/754.03 |

(Continued)

*Primary Examiner* — Adolf D Berhane
*Assistant Examiner* — Shahzeb K Ahmad
(74) *Attorney, Agent, or Firm* — Christos S. Kyriakou

(57) ABSTRACT

A solid state switch power emulator circuit, the circuit including a high voltage section including a high voltage power supply (HVPS); a high voltage capacitor (HVC) electronically connected to the HVPS in parallel; a high voltage switch (HVS) electronically connected to the HVC and the HVPS in series; and a high voltage load (HVL) electronically connected to the HVS in series; a low voltage section including a low voltage power supply (LVPS); a low voltage capacitor (LVC) electronically connected to the LVPS in parallel; a low voltage switch (LVS) electronically connected to the LVPS and the LVC in series; a low voltage load (LVL) electronically connected to the LVS in series; and a high voltage diode (HVD) electronically connected to the LVL in series, wherein voltage levels associated with the low voltage section are less than voltage levels associated with the high voltage section.

18 Claims, 11 Drawing Sheets

(56) References Cited

U.S. PATENT DOCUMENTS

2013/0069666 A1* 3/2013 Wong .................... G01R 31/40
                                                      324/511
2015/0323590 A1* 11/2015 Xu ...................... G01R 31/2886
                                                      324/762.02

* cited by examiner

SOLID STATE SWITCH POWER EMULATOR

CROSS REFERENCE TO RELATED APPLICATION

This application claims the benefit of U.S. Provisional Patent Application No. 62/346,721 filed on Jun. 7, 2016, the contents of which, in its entirety, is herein incorporated by reference.

GOVERNMENT INTEREST

The embodiments herein may be manufactured, used, and/or licensed by or for the United States Government without the payment of royalties thereon.

BACKGROUND

Technical Field

The embodiments herein generally relate to electronic circuits, and more particularly to a switch power emulator circuit.

Description of the Related Art

High voltage silicon carbide insulated-gate bipolar transistors (IGBTs) with ratings above 10 kV are becoming suitable for use in continuous power applications. To verify these components for continuous power operation requires power supplies, capacitors, and loads which may become dangerous and expensive at these high power levels. It is desirable to provide a safe environment for accurate testing of the high voltage silicon carbide IGBTs.

SUMMARY

In view of the foregoing, an embodiment herein provides a solid state switch power emulator circuit, the circuit comprising a high voltage section comprising a high voltage power supply (HVPS); a high voltage capacitor (HVC) electronically connected to the HVPS in parallel; a high voltage switch (HVS) electronically connected to the HVC and the HVPS in series; and a high voltage load (HVL) electronically connected to the HVS in series; a low voltage section comprising a low voltage power supply (LVPS); a low voltage capacitor (LVC) electronically connected to the LVPS in parallel; a low voltage switch (LVS) electronically connected to the LVPS and the LVC in series; a low voltage load (LVL) electronically connected to the LVS in series; and a high voltage diode (HVD) electronically connected to the LVL in series, wherein voltage levels associated with the low voltage section are less than voltage levels associated with the high voltage section.

The high voltage section may be electronically connected to the low voltage section in parallel. The high voltage section and the low voltage section may be electronically connected to a device under test (DUT) in parallel, and wherein the high voltage section and the low voltage section may be configured to emulate an electrical power being switched through the DUT. A LVS gate signal may be triggered on after a first delay time after a DUT gate signal is triggered on.

The DUT gate signal may be triggered off a second delay time after the LVS gate signal is triggered off. A HVS gate signal may be triggered off after a third delay time after the DUT gate signal is triggered on. The DUT gate signal may be triggered off a fourth delay time after the HVS gate signal is triggered on.

An embodiment herein provides a solid state switch power emulator circuit, the circuit comprising a high voltage section comprising a high voltage power supply (HVPS); a high voltage capacitor (HVC) electronically connected to the HVPS in parallel; a high voltage switch (HVS) electronically connected to the HVC and the HVPS in series; and a high voltage load (HVL) electronically connected to the HVS in series; a low voltage section comprising a low voltage power supply (LVPS); a low voltage capacitor (LVC) electronically connected to the LVPS in parallel; a low voltage switch (LVS) electronically connected to the LVPS and the LVC in series; a low voltage load (LVL) electronically connected to the LVS in series; and a high voltage diode (HVD) electronically connected to the LVL in series, wherein the high voltage section and the low voltage section are electronically connected to each other and to a device under test (DUT) in parallel, wherein voltage levels associated with the low voltage section are less than voltage levels associated with the high voltage section, and wherein the high voltage section and the low voltage section are configured to emulate an electrical power being switched through the DUT.

A LVS gate signal may be triggered on after a first delay time after a DUT gate signal is triggered on, and wherein the DUT gate signal may be triggered off a second delay time after the LVS gate signal is triggered off. A HVS gate signal may be triggered off after a third delay time after the DUT gate signal is triggered on, and wherein the DUT gate signal may be triggered off a fourth delay time after the HVS gate signal is triggered on. The HVS gate signal may be triggered off a fifth delay time before the LVS gate signal is triggered on. The HVS gate signal may be triggered on a sixth delay time before the DUT gate signal is triggered off.

An embodiment herein provides a method for switching an electrical power through a device under test (DUT), the method comprising electronically connecting the DUT to a high voltage section of a circuit and to a low voltage section of the circuit, wherein the high voltage section and the low voltage section of the circuit are connected to each other and to the DUT in parallel, wherein voltage levels associated with the low voltage section are less than voltage levels associated with the high voltage section, and wherein the high voltage section comprises a high voltage power supply (HVPS); a high voltage capacitor (HVC) electronically connected to the HVPS in parallel; a high voltage switch (HVS) electronically connected to the HVC and the HVPS in series; and a high voltage load (HVL) electronically connected to the HVS in series.

The low voltage section may comprise a low voltage power supply (LVPS); a low voltage capacitor (LVC) electronically connected to the LVPS in parallel; a low voltage switch (LVS) electronically connected to the LVPS and the LVC in series; a low voltage load (LVL) electronically connected to the LVS in series; and a high voltage diode (HVD) electronically connected to the LVL in series.

The method may further comprise triggering a LVS gate signal on, after a first delay time after a DUT gate signal is triggered on. The method may further comprise triggering the DUT gate signal off, a second delay time after the LVS gate signal is triggered off. The method may further comprise triggering a HVS gate signal off, after a third delay time after the DUT gate signal is triggered on. The method may further comprise triggering the DUT gate signal off a fourth delay time after the HVS gate signal is triggered on.

The method may further comprise triggering the HVS gate signal off a fifth delay time before the LVS gate signal is triggered on. The method may further comprise triggering the HVS gate signal on a sixth delay time before the DUT gate signal is triggered off.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which.

DETAILED DESCRIPTION

Figure 1:
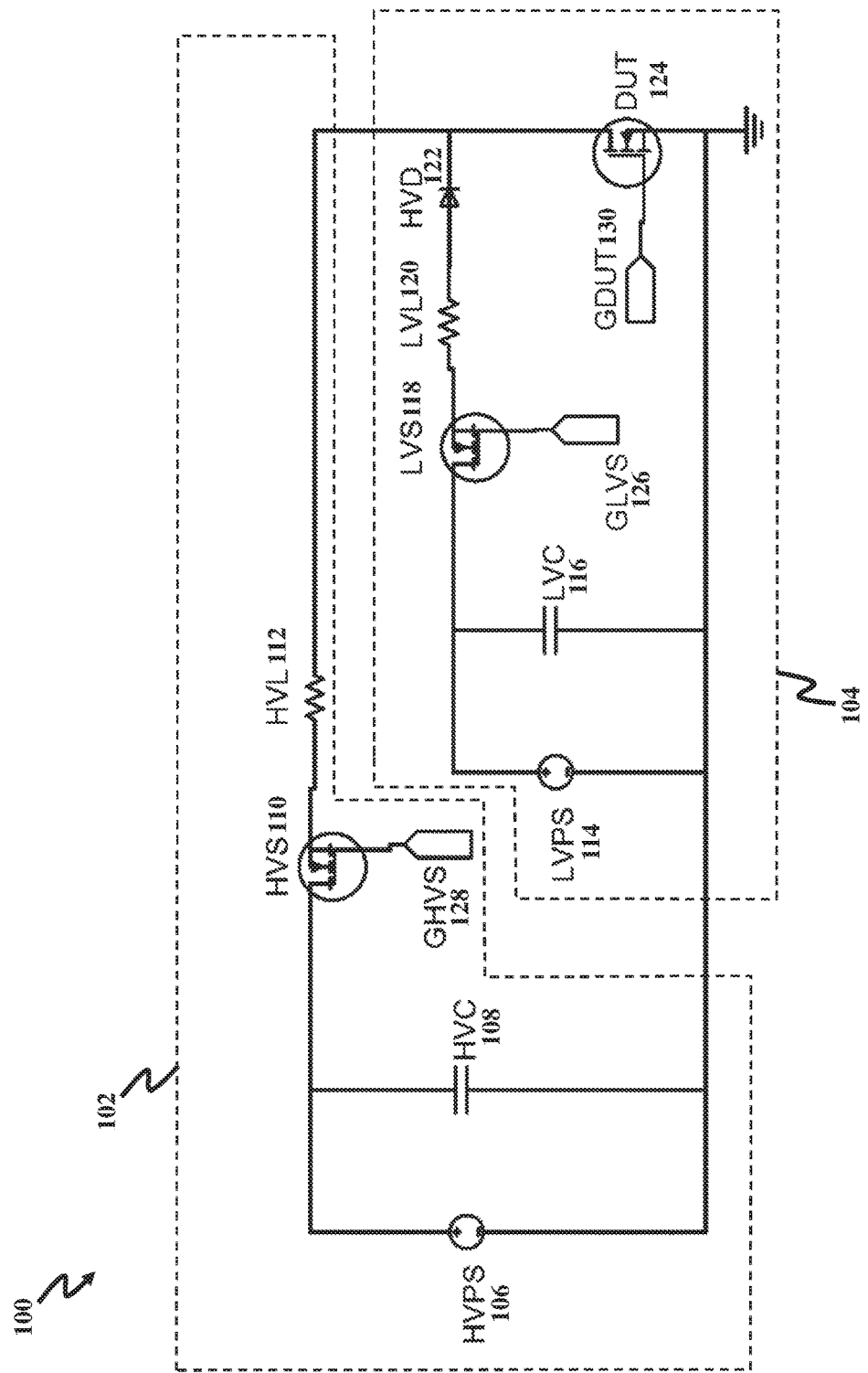
FIG. 1 illustrates a schematic diagram of a circuit to emulate power being switched through the device under test (DUT) according to an embodiment herein.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

The embodiments herein provide circuits configured to run a device under test (DUT) under the same conditions as a conventional setup, but supplying only the DUT loss power therefore using much smaller power supplies, lower energy capacitors, and a lower power load for a less expensive and far safer testbed.

When evaluating a device for continuous power applications one may look at the switching loss and the conduction loss to understand how it will respond in use. Compared to the power the device is delivering the power consumed by the device in switching and conduction losses are minimal. But, however minimal the device losses are, they are important for the determination of how efficient the device is and its expected lifetime. In some embodiments herein, by using a high voltage power supply (HVS) and a low voltage power supply (LVS), the DUT is subjected to the switching and conduction losses it would see if it were in a typical high power circuit.

An embodiment herein provides a circuit that provides power to cover the losses a solid state switch would see if it were switching power through it. An embodiment herein uses two power supplies to produce a voltage and current waveform to the DUT. The embodiments herein provide for effective and greatly efficient long term power switching test of new high voltage solid state devices.

Referring now to the drawings, and more particularly to FIGS. 1 through 11, where similar reference characters denote corresponding features consistently throughout the figures, there are shown preferred embodiments.

FIG. 1 is a schematic diagram illustrating a solid state switch power emulator circuit 100 according to an embodiment herein. The circuit 100 includes a high voltage section 102 and a low voltage section 104. In an embodiment herein, the high voltage section 102 is connected in parallel to the low voltage section 104.

In an embodiment herein, the high voltage section 102 includes a high voltage power supply (HVPS) 106, high voltage capacitor (HVC) 108, high voltage switch (HVS) 110, and a high voltage load (HVL) 112. The HVC 108 may be connected to the HVPS 106 in parallel. The HVS 110 and the HVL 112 may be connected in series to each other and to the combination of the HVC 108 and the HVPS 106.

In an embodiment herein, the low voltage section 104 includes a low voltage power supply (LVPS) 114, low voltage capacitor (LVC) 116, low voltage switch (LVS) 118, low voltage load (LVL) 120 and high voltage diodes (HVD) 122. The LVC 116 may be connected in parallel to the LVPS 114. The LVS 118, the LVL 120, and the HVD 122 may be connected to each other and to the combination of the LVC 116 and the LVPS 114, in series.

In an embodiment herein, the components of the solid state switch power emulator circuit 100 are arranged in a circuit as shown in FIG. 1 to emulate power being switched through the device under test (DUT) 124.

In an embodiment herein, the DUT 126 is triggered using a gate signal for DUT 124, namely GDUT 130 electronically coupled to the DUT 126. The LVS 118 may be triggered by a gate signal for the LVS 118, namely GLVS 126 electronically coupled to the LVS 118. The HVS 110 may be triggered by a gate signal for the HVS 110, namely GHVS 128 electronically coupled to the HVS 110.

In an embodiment herein, for proper operation, the three switches HVS 110, LVS 118, and DUT 124 are triggered in a certain, predetermined sequence. In an embodiment herein, the three switches HVS 110, LVS 118, and DUT 124 are triggered according to the sequence illustrated in FIG. 2 through FIG. 4.

Figure 2:
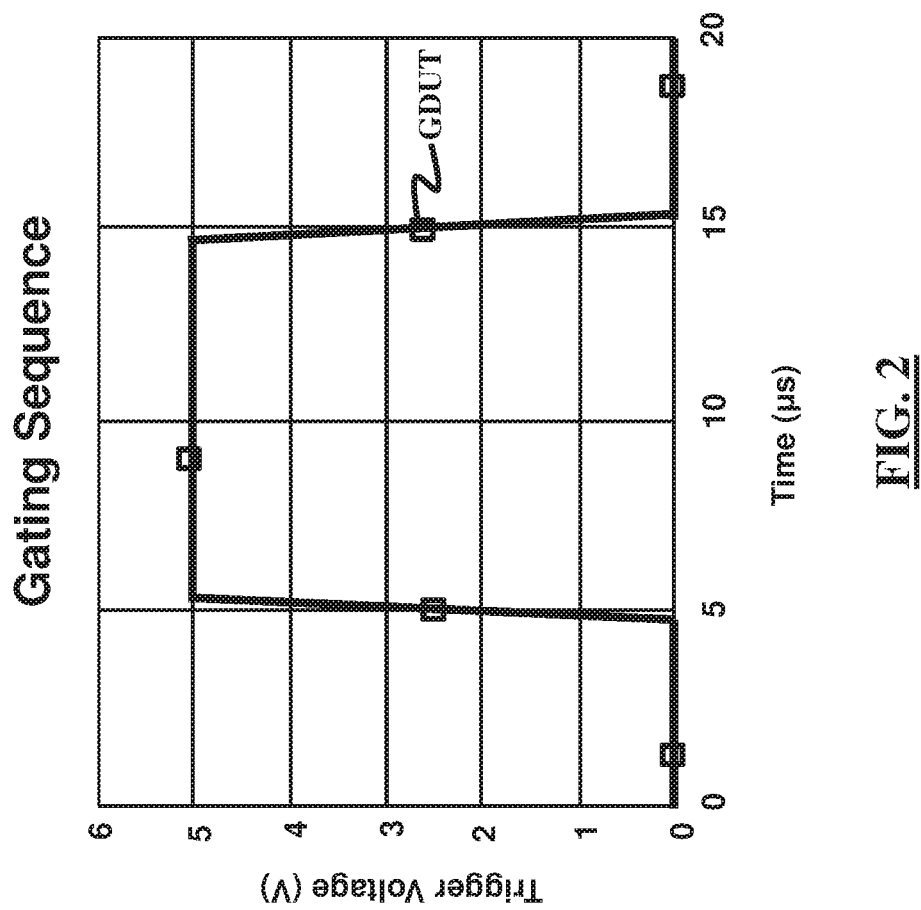
FIG. 2 illustrates a diagram of a gate signal for the DUT (GDUT) according to an embodiment herein.

FIG. 2, with reference to FIG. 1, is a diagram illustrating the gate signal for the DUT 124 (GDUT 130) which provides the switching frequency and duty cycle for which the DUT, according to an exemplary embodiment herein. FIG. 2 illustrates an exemplary GDUT 130 voltage versus time.

In an embodiment herein, the gate signal for the LVS 118 (GLVS 126) must be triggered on some delayed time after the GDUT 130 has been triggered on, and the GLVS 126 must be triggered off some delay time before the GDUT 130 is triggered off.

Figure 3:
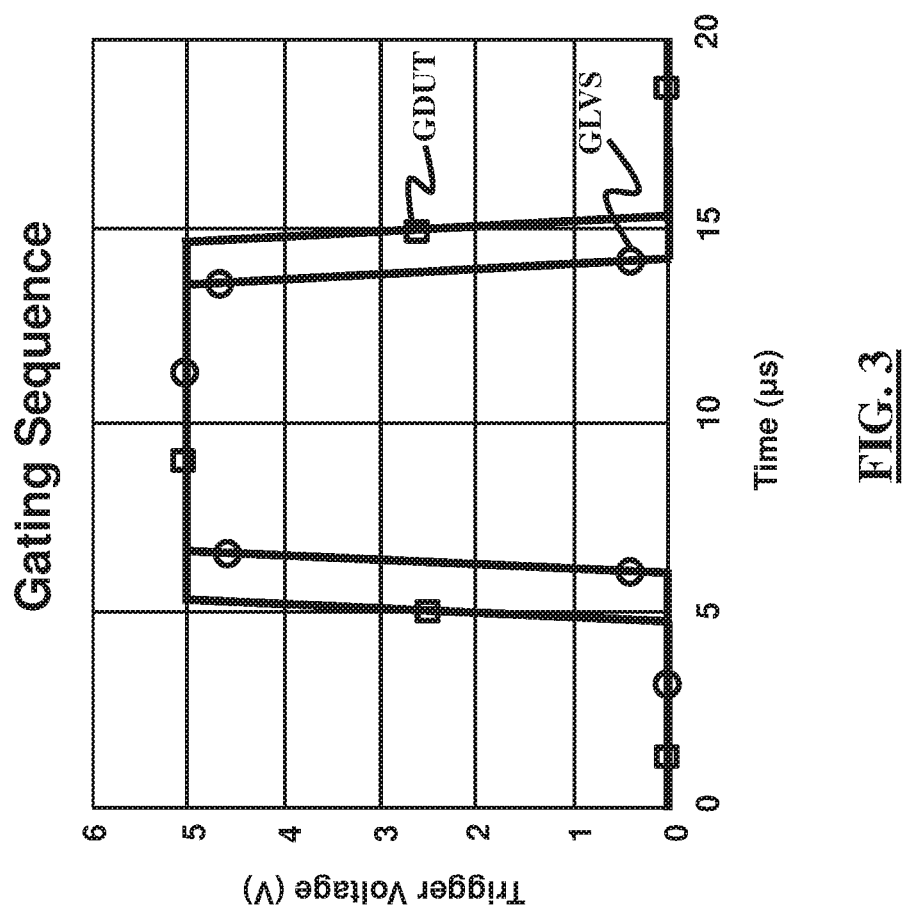
FIG. 3 illustrates a diagram illustrating GDUT and a gate signal for a low voltage switch (GLVS) according to an embodiment herein.

FIG. 3, with reference to FIGS. 1 through 2, illustrates the GLVS 126 and the GDUT 130 trigger voltages versus time according to an exemplary embodiment herein. In the example illustrated by FIG. 3, there is a 1 μs delay between the GDUT 130 trigger voltage coming on and then the GLVS 126 trigger voltage coming on, and a 1 μs delay between the GLVS 126 trigger voltage going off and then the GDUT 130 trigger voltage going off.

In an embodiment herein, when only the LVS 118 and the DUT 124 switches are in operation, it allows an on state current to flow through the DUT 124 without the switching losses of the DUT 124, because the DUT 124 is gated on before the LVS 118 can supply current and the LVS 118 interrupts the current before the DUT 124 is switched off which is referred to as soft switching herein.

In an embodiment herein, the gate signal for the HVS 110 (GHVS 128) is an inverse of the GLVS 126. This may allow high voltage to be present when the DUT 124 is off and also during the transition time when the DUT 124 is triggered on and off. Since high voltage is present during the DUT 124 transition time, it will allow the appropriate switching losses for the DUT 124 to be obtained.

Figure 4:
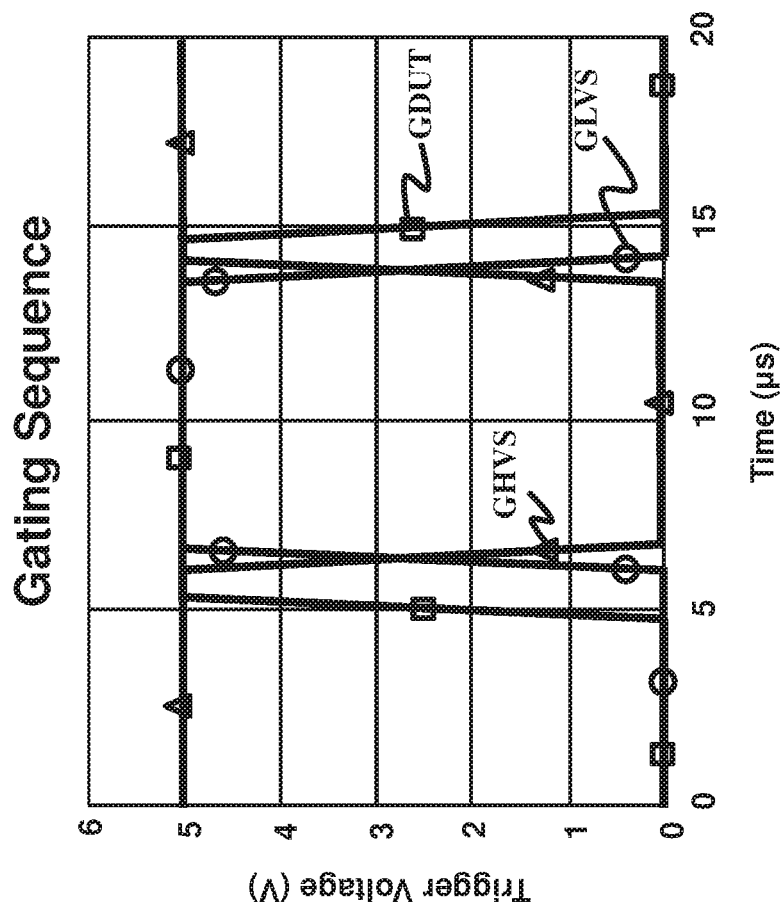
FIG. 4 illustrates a diagram of a full gating sequence according to an embodiment herein.

FIG. 4, with reference to FIGS. 1 through 3, is a diagram illustrating a full gating sequence of the GHVS 128, GLVS 126, and GDUT 130, according to an exemplary embodiment herein. The gate signal of the HVS 110 (GHVS 128) may be a direct inverse of the gate signal of the LVS 118 (GLVS 126). As illustrated in FIG. 4, the GHVS 128 turns off with a time delay after when the GDUT 130 turns on, and a time delay before the GLVS 126 turns on. The GHVS 128 turns on a time delay after the GLVS 126 turns off and a time delay before the GDUT 130 turns off.

In an embodiment herein, the gating sequence will produce two sets of current waveforms that the circuit 100 combines to provide the appropriate current through the DUT. When the GDUT 130 and the GLVS 126 are the only gates in operation the current through the DUT 124 is the same as the current through the LVS 118.

Figure 5:
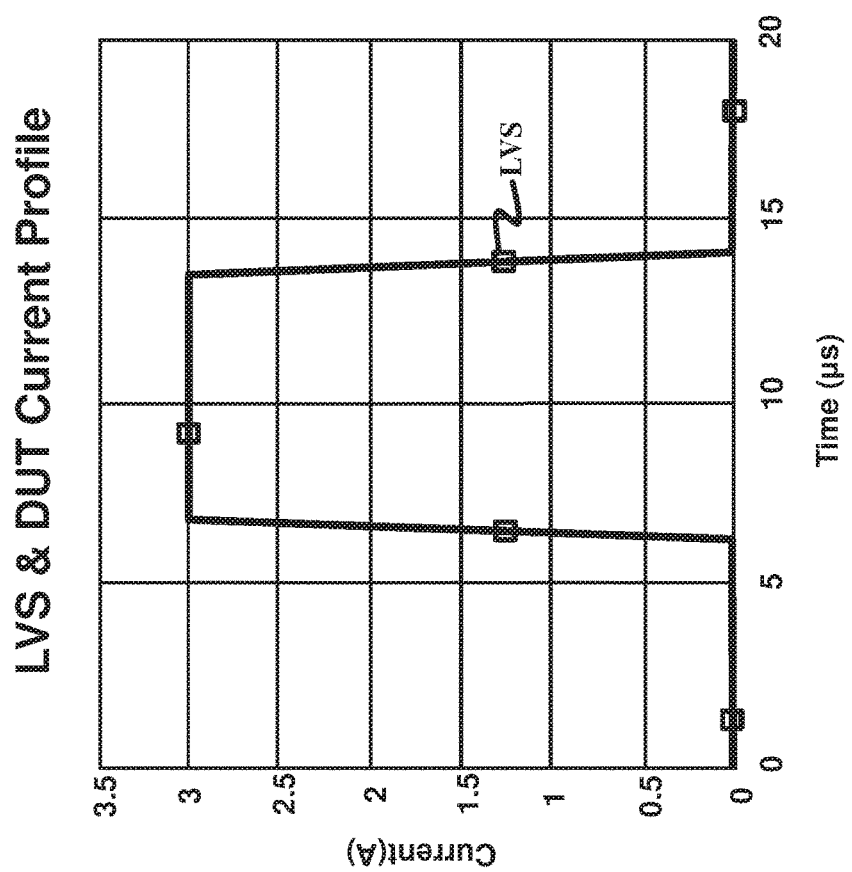
FIG. 5 illustrates a diagram of a current through the DUT is shown when the GDUT and GLVS are the only gates in operation according to an embodiment herein.

FIG. 5, with reference to FIGS. 1 through 4, is a diagram illustrating the current through the LVS 118 (or through the DUT 124), when the GDUT 130 and the GLVS 126 are the only gates in operation in the circuit 100, according to an embodiment herein. This current waveform may be a soft switching profile of the DUT 124, because there are no switching losses in the DUT 124.

Figure 6:
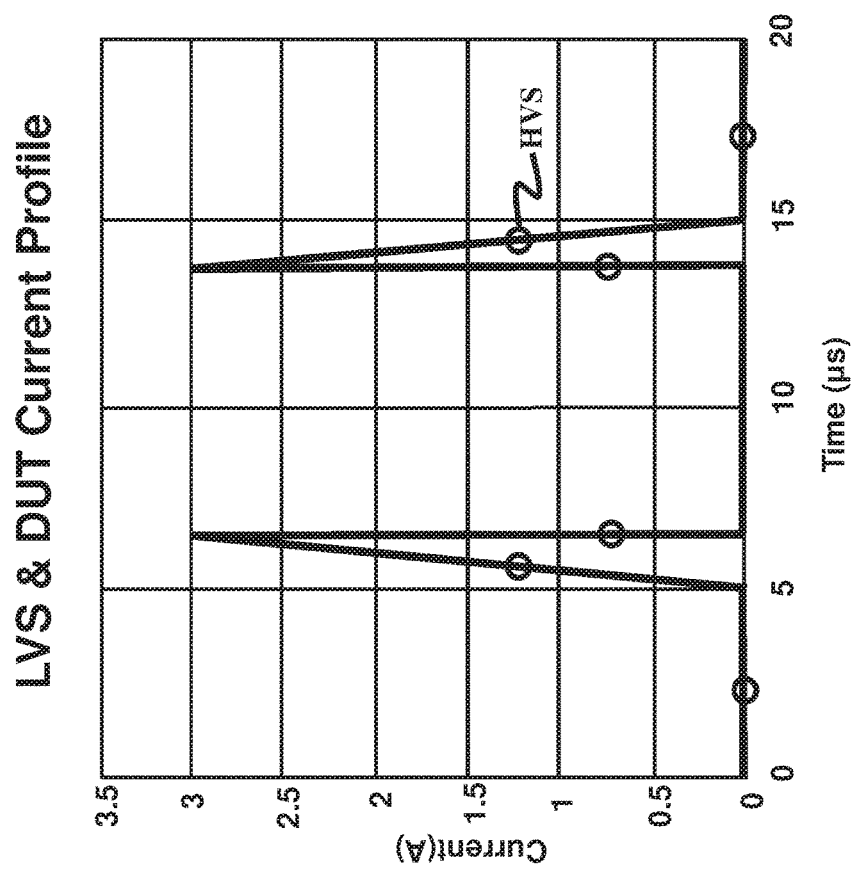
FIG. 6 illustrates a diagram of the DUT current when only the GDUT and GHVS are operated according to an embodiment herein.

FIG. 6, with reference to FIGS. 1 through 5, is a diagram illustrating the current provided through the HVS 110 if only the GDUT 130 and the GHVS 128 are operated. This waveform may produce only the currents that are associated to the switching loss of the DUT 124.

Figure 7:
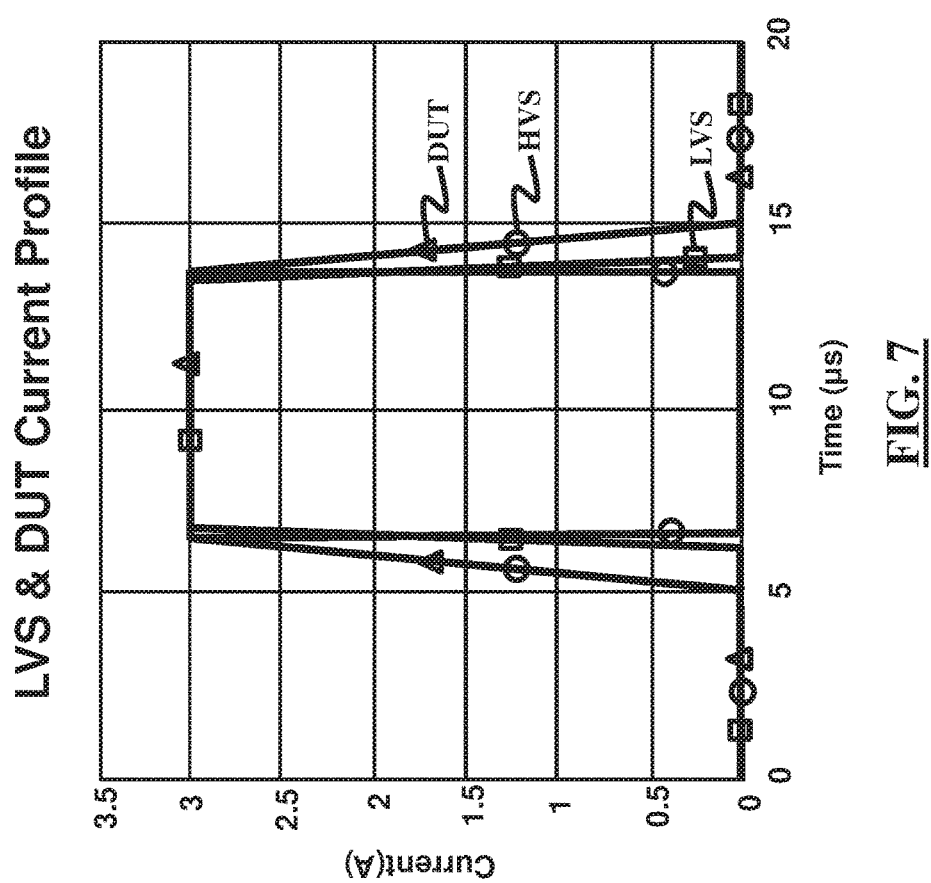
FIG. 7 illustrates a diagram of a combined DUT current (DUTC) according to an embodiment herein.

FIG. 7, with reference to FIGS. 1 through 6, is a diagram illustrating the current through the DUT 124, the HVS 110, and the LVS 118 when the GDUT 130, the GHVS 128, and the GLVS 126 are switched in the sequence as shown in FIG. 4, according to an embodiment herein. As illustrated in FIG. 7, the currents illustrated in FIG. 5 and FIG. 6 are combined to produce the current though the DUT 124, as illustrated in FIG. 7.

In an embodiment herein, the circuit 100 is configured to switch 1.1 kV, 2 A at 1 kHz through an insulated gate bipolar transistor (IGBT).

Figure 8:
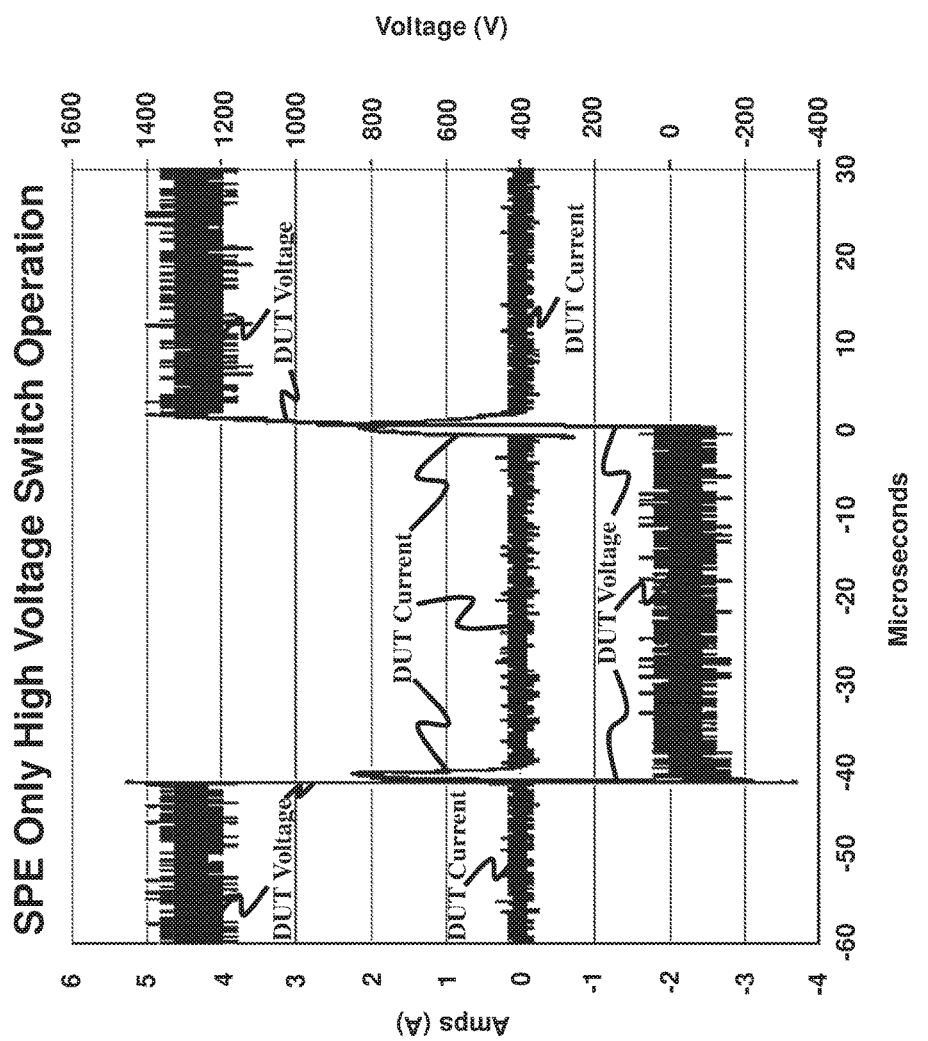
FIG. 8 illustrates a diagram of power emulator circuitry results according to an embodiment herein.

FIG. 8, with reference to FIGS. 1 through 7, is a diagram illustrating simulation results of the voltage and current of the DUT 124, according to an exemplary embodiment herein. As illustrated in the example of FIG. 8, approximately 1.1 kV is switched producing a current of 2 A in the DUT 124. The 2 A current is only sustained for approximately 1 μs from the DUT 124 being turned on and reintroduced 1 μs before the DUT 124 is turned off to block the 1.1 kV, according to an exemplary embodiment herein.

Figure 9:
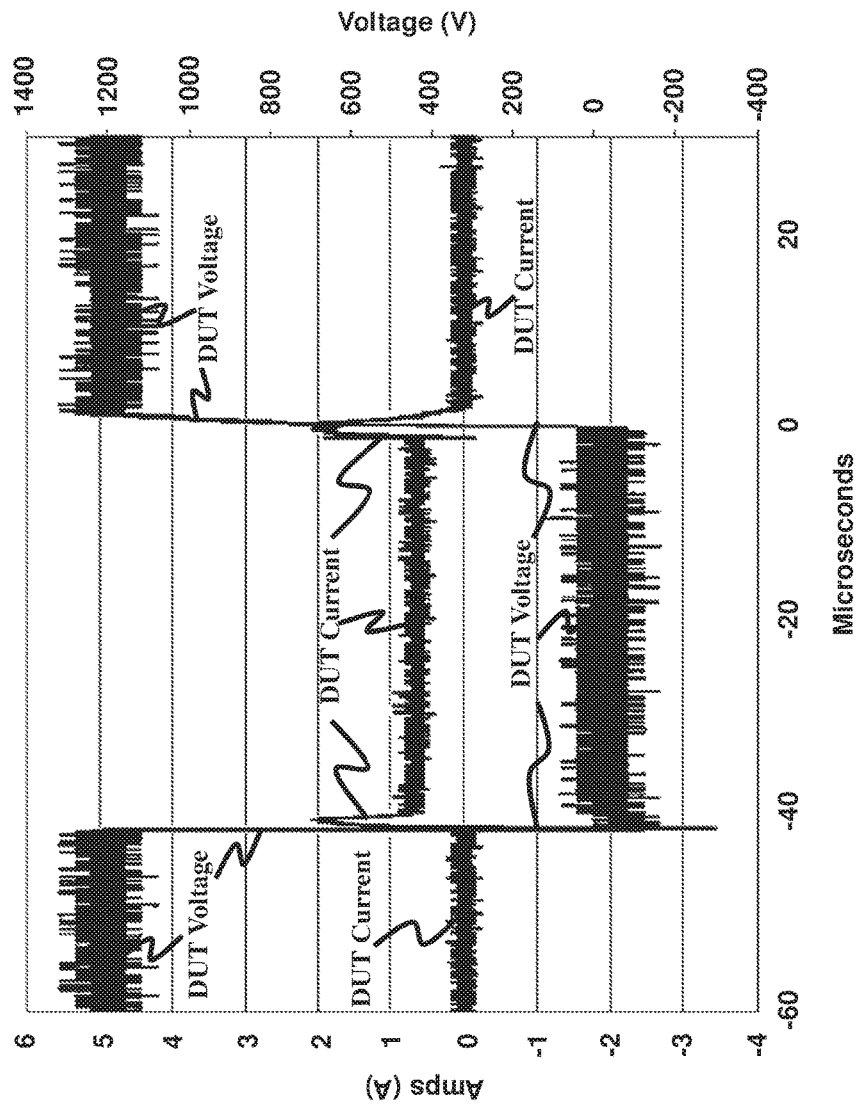
FIG. 9 illustrates a diagram of the power emulator as well as the controller and DUT according to an embodiment herein.

FIG. 9, with reference to FIGS. 1 through 8, is a diagram illustrating simulation results of the voltage and current of the DUT 124 while the circuit 100 is running with the LVS 118 activated and the LVPS 114 raised to produce approximately 1 A, according to an exemplary embodiment herein. This gives a mismatched current waveform through the DUT 124, as shown in the example illustrated in FIG. 9.

Figure 10:
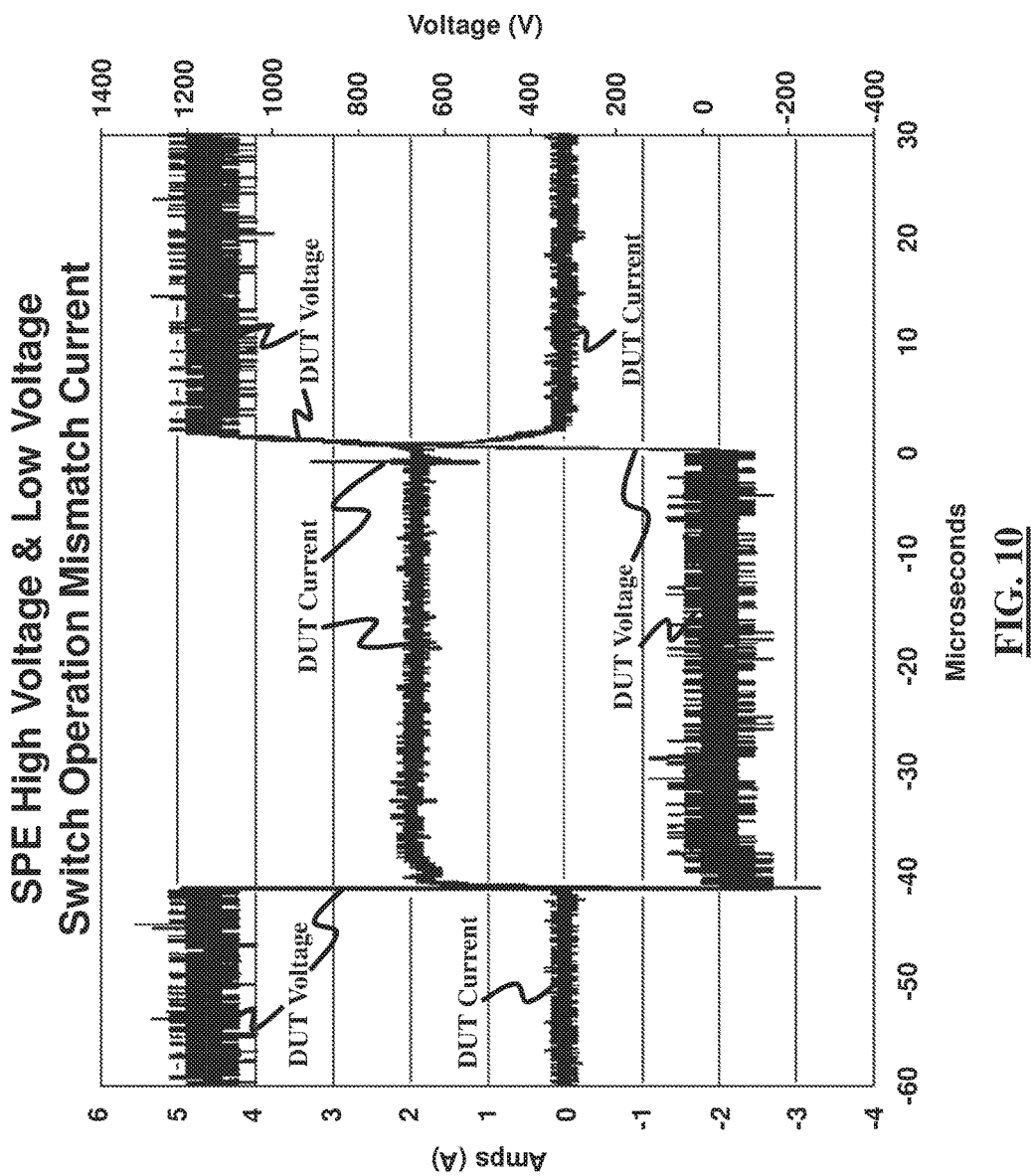
FIG. 10 illustrates a diagram of the power emulator circuitry results according to an embodiment herein.

FIG. 10, with reference to FIGS. 1 through 9, is a diagram illustrating simulation results of the voltage and current of the DUT 124, when the LVPS 114 is increased to produce approximately 2 A during the on state of the DUT 124. This gives a matched current waveform through the DUT 124, as shown in the example illustrated in FIG. 10.

Figure 11:
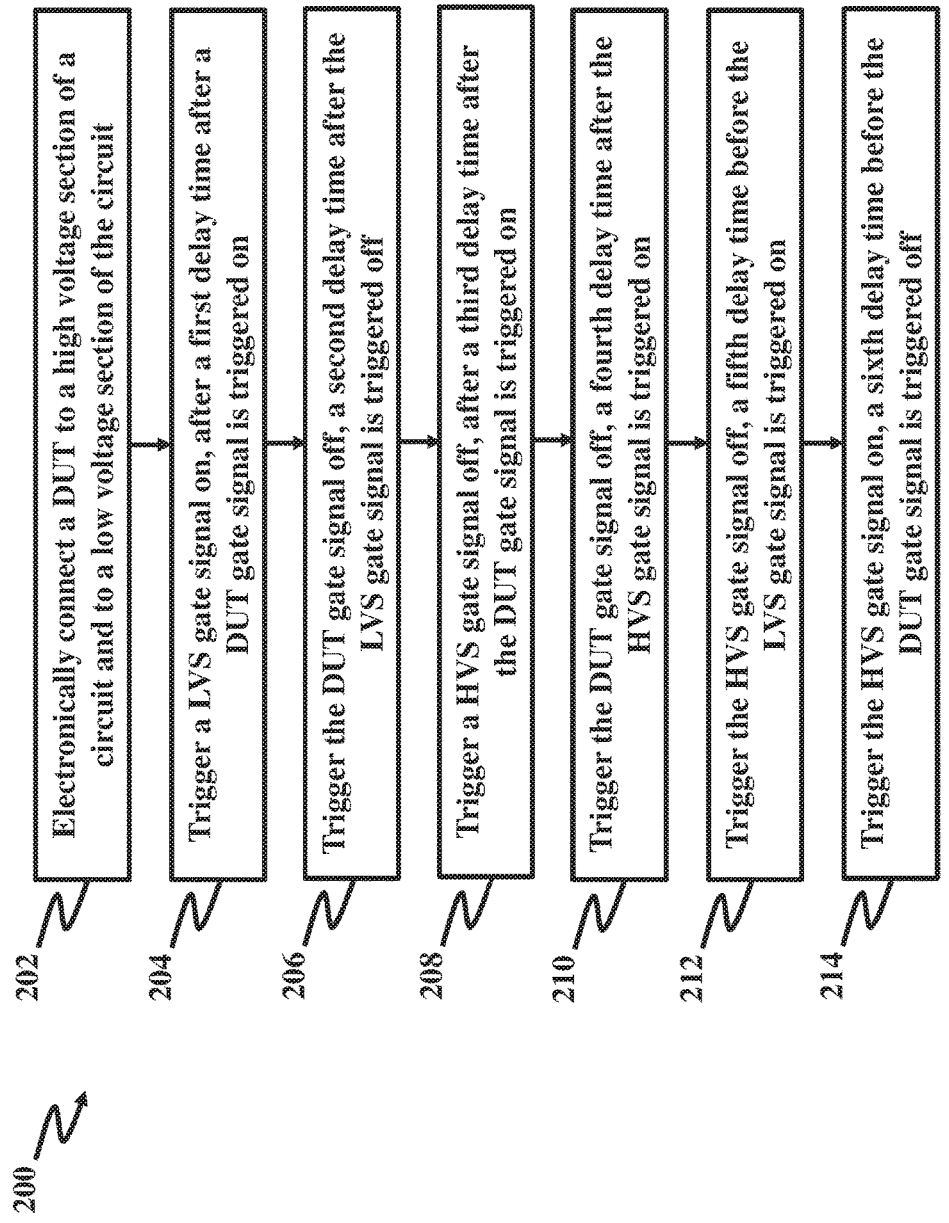
FIG. 11 is a flowchart illustrating a method for switching an electrical power through a DUT according to an embodiment herein.

FIG. 11, with reference to FIGS. 1 through 10, is a flowchart illustrating a method 200, according to an embodiment herein. The method 200 may electronically connect (202) a DUT 124 to a high voltage section 102 of a circuit 100, and to a low voltage section 104 of the circuit 100; trigger (204) a LVS gate signal (GLVS 126) on, after a first delay time after a DUT gate signal (GDUT 130) is triggered on; trigger (206) the DUT gate signal (GDUT 130) off, a second delay time after the LVS gate signal (GLVS 126) is triggered off; trigger (208) a HVS gate signal (GHVS 128) off, after a third delay time after the DUT gate signal (GDUT 130) is triggered on; trigger (210) the DUT gate signal (GDUT 130) off, a fourth delay time after the HVS gate signal (GHVS 128) is triggered on; trigger (212) the HVS gate signal (GHVS 128) off, a fifth delay time before the LVS gate signal (GLVS 126) is triggered on; and trigger (214) the HVS gate signal (GHVS 128) on, a sixth delay time before the DUT gate signal (GDUT 130) is triggered off.

The embodiments herein solve the problem of costly overhead of waste energy or the risk of other experimental components in device evaluation. The embodiments herein alternate between a high voltage and low voltage power supply to produce one waveform to evaluate the power switch device.

In the embodiments herein, high voltage devices and section of the circuit 100 are capable of handling higher voltage levels than low voltage devices and section of the circuit 100. For example, HVC 108, GHVS 128, HVS 110, and HVL 112 can operate at higher voltage levels than LVC 116, GLVS 126, LVS 118, and LVL 120, and the HVPS 106 source can produce higher voltage output than LVPS 114 source.

In an exemplary embodiment herein, the HVC 108, GHVS 128, HVS 110, HVL 112 devices and the high voltage section 102, can operate in voltage levels above 10 kV, and the low voltage section 104 and the LVC 116, GLVS 126, LVS 118, LVL 120, HVD 122, GDUT 130, and DUT 124 can operate in voltage levels below 10 kV. In an exemplary embodiment herein, the HVPS 106 source can produce signals with a voltage higher than 10 kV, and the LVPS 114 source can produce output signal with a voltage lower than 10 kV. In the embodiments herein, the capacitors HVC 108, LVC 116 may have any capacitance value. In the embodiments herein, the loads HVL 112, and LVL 120 may have any impedance value. In the illustrated embodiments HVS 110, LVS 118 and DUT 124 are shown as high and low voltage switches and metal-oxide-semiconductor field-effect transistor (MOSFETs). However, should be understood by persons of skill in the art that HVS 110, LVS 118 and DUT 124 can be any type of solid state switch.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A solid state switch power emulator circuit, said circuit comprising:
   a high voltage section comprising:
      a high voltage power supply (HVPS);
      a high voltage capacitor (HVC) electronically connected to said HVPS in parallel;
      a high voltage switch (HVS) electronically connected to said HVC and said HVPS in series; and
      a high voltage load (HVL) electronically connected to said HVS in series;
   a low voltage section comprising:
      a low voltage power supply (LVPS);
      a low voltage capacitor (LVC) electronically connected to said LVPS in parallel;
      a low voltage switch (LVS) electronically connected to said LVPS and said LVC in series;
      a low voltage load (LVL) electronically connected to said LVS in series; and
      a high voltage diode (HVD) electronically connected to said LVL in series,
   wherein voltage levels associated with the low voltage section are less than voltage levels associated with the high voltage section
   wherein said high voltage section is electronically connected to said low voltage section
   and further wherein said high voltage section and said low voltage section are electronically connected to a device under test (DUT) in parallel, and wherein said high voltage section and said low voltage section are configured to emulate an electrical power being switched through said DUT.

2. The circuit of claim 1, wherein a LVS gate signal is triggered on after a first delay time after a DUT gate signal is triggered on.

3. The circuit of claim 2, wherein said DUT gate signal is triggered off a second delay time after said LVS gate signal is triggered off.

4. The circuit of claim 3, wherein a HVS gate signal is triggered off after a third delay time after said DUT gate signal is triggered on.

5. The circuit of claim 4, wherein said DUT gate signal is triggered off a fourth delay time after said HVS gate signal is triggered on.

6. A solid state switch power emulator circuit, said circuit comprising:
   a high voltage section comprising:
      a high voltage power supply (HVPS);
      a high voltage capacitor (HVC) electronically connected to said HVPS in parallel;
      a high voltage switch (HVS) electronically connected to said HVC and said HVPS in series; and
      a high voltage load (HVL) electronically connected to said HVS in series;
   a low voltage section comprising:
      a low voltage power supply (LVPS);
      a low voltage capacitor (LVC) electronically connected to said LVPS in parallel;
      a low voltage switch (LVS) electronically connected to said LVPS and said LVC in series;
      a low voltage load (LVL) electronically connected to said LVS in series; and
      a high voltage diode (HVD) electronically connected to said LVL in series,
   wherein said high voltage section and said low voltage section are electronically connected to each other and to a device under test (DUT) in parallel, wherein voltage levels associated with the low voltage section are less than voltage levels associated with the high voltage section, and wherein said high voltage section and said low voltage section are configured to emulate an electrical power being switched through said DUT.

7. The circuit of claim 6, wherein a LVS gate signal is triggered on after a first delay time after a DUT gate signal is triggered on, and wherein said DUT gate signal is triggered off a second delay time after said LVS gate signal is triggered off.

8. The circuit of claim 7, wherein a HVS gate signal is triggered off after a third delay time after said DUT gate signal is triggered on, and wherein said DUT gate signal is triggered off a fourth delay time after said HVS gate signal is triggered on.

9. The circuit of claim 8, wherein said HVS gate signal is triggered off a fifth delay time before said LVS gate signal is triggered on.

10. The circuit of claim 9, wherein said HVS gate signal is triggered on a sixth delay time before said DUT gate signal is triggered off.

11. A method for switching an electrical power through a device under test (DUT), said method comprising:
   electronically connecting said DUT to a high voltage section of a circuit and to a low voltage section of said circuit, wherein said high voltage section and said low voltage section of said circuit are connected to each other and to said DUT in parallel, wherein voltage levels associated with the low voltage section are less than voltage levels associated with the high voltage section, and wherein said high voltage section comprising:
      a high voltage power supply (HVPS);
      a high voltage capacitor (HVC) electronically connected to said HVPS in parallel;
      a high voltage switch (HVS) electronically connected to said HVC and said HVPS in series; and a high voltage load (HVL) electronically connected to said HVS in series.

12. The method of claim 11, wherein said low voltage section comprising:
a low voltage power supply (LVPS);
a low voltage capacitor (LVC) electronically connected to said LVPS in parallel;
a low voltage switch (LVS) electronically connected to said LVPS and said LVC in series;
a low voltage load (LVL) electronically connected to said LVS in series; and
a high voltage diode (HVD) electronically connected to said LVL in series.

13. The method of claim 12, further comprising triggering a LVS gate signal on, after a first delay time after a DUT gate signal is triggered on.

14. The method of claim 13, further comprising triggering said DUT gate signal off, a second delay time after said LVS gate signal is triggered off.

15. The method of claim 14, further comprising triggering a HVS gate signal off, after a third delay time after said DUT gate signal is triggered on.

16. The method of claim 15, further comprising triggering said DUT gate signal off a fourth delay time after said HVS gate signal is triggered on.

17. The method of claim 16, further comprising triggering said HVS gate signal off a fifth delay time before said LVS gate signal is triggered on.

18. A method of claim 17, further comprising triggering said HVS gate signal on a sixth delay time before said DUT gate signal is triggered off.

* * * * *